Figure 1:
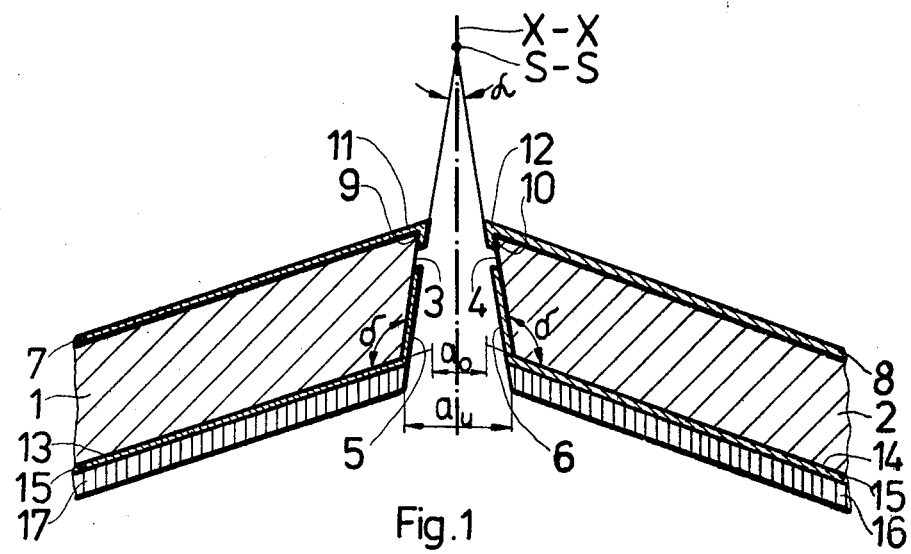

United States Patent [19]

Kuschel et al.

[11] 4,409,487

[45] Oct. 11, 1983

[54] ELECTRODE ARRANGEMENT FOR ELECTROSTATIC DEFLECTION SYSTEM

[76] Inventors: Georg Kuschel, 16, W.-Pieck-Str., JENA-Lobeda, District of Gera; Hartmut Reinhardt, 59b, Grobschwabhausen, District of Erfurt, both of German Democratic Rep.

[21] Appl. No.: 267,562

[22] Filed: May 27, 1981

[30] Foreign Application Priority Data

Jul. 1, 1980 [DD] German Democratic Rep. ... 222294

[51] Int. Cl.³ .............................................. H01J 37/26
[52] U.S. Cl. ................................. 250/398; 250/396 R
[58] Field of Search .......... 250/492.2, 492.3, 396 ML, 250/398, 396 R; 313/361.1

[56] References Cited

U.S. PATENT DOCUMENTS

| 3,697,793 | 10/1972 | King | 313/361.1 |
| 4,130,761 | 12/1978 | Matsuda | 250/398 |
| 4,200,794 | 4/1980 | Newberry | 250/396 ML |
| 4,224,523 | 9/1980 | Crean | 250/398 |

Primary Examiner—Bruce C. Anderson

[57] ABSTRACT

The invention relates to an electrode arrangement of an electrostatic deflection system for corpuscular beams comprising a plurality of electrodes adjacently arranged on opposing faces of said deflection system. At least one of two opposing electrodes on the opposing faces is provided with an individual potential supply. The portions of the faces between the electrodes in one line which are facing the corpuscular beam are electrically conductive. The inventive arrangement permits the control of one or a plurality of corpuscular beams simultaneously and/or individually, which considerably increases the output of an electron beam processing device.

11 Claims, 6 Drawing Figures

U.S. Patent   Oct. 11, 1983   Sheet 1 of 2   4,409,487

ELECTRODE ARRANGEMENT FOR ELECTROSTATIC DEFLECTION SYSTEM

The invention relates to an electrode arrangement for an electrostatic deflection system for deflecting corpuscular radiation in which opposing electrodes of adjustable potential are provided for deflecting at least one corpuscular beam, particularly for use in electron beam or ion beam processing devices.

Previous devices of the kind have one or two couple(s) of deflecting electrodes which deflect the corpuscular beam of non-varying or variable cross-section in one or two directions.

The processing of complicted structures, however, requires that the corpuscular beam is shaped in a time-sequence schedule.

However, the output of the known processing devices is limited by the time required to transmit an information from an information store to a target to be correspondingly irradiated.

It is a further disadvantage that only a limited beam energy can be transmitted by using only one corpuscular beam.

It is an object of the invention to obviate the above disadvantages.

It is a further object of the invention to increase the productivity in corpuscular beam irradiation devices.

It is still a further object of the invention to provide an electrostatic deflection device which permits a simultaneous control of one corpuscular scanning beam or a plurality of static corpuscular beams independently on each other by a suitable arrangement and configuration of electrodes. These and other objects are realised by a plurality of electrodes arranged upon at least one couple of opposing substantially symmetrical faces. The plurality of electrodes on each face are adjacently arranged in a line and each electrode on at least one of the faces has an individual potential supply connection. The portion of the faces between the electrodes are electrically conductive. The invention permits a fast deflection of corpuscular beams at a variety of geometries in the target plane.

Furthermore, each corpuscular beam can be individually blacked out in cooperation with a scanning aperture and respective means.

In a simple embodiment of the invention the electrodes of one of the two faces are electrically connected with one another.

Preferably said electrodes are connected to form a common conductive face.

Advantageously, the electrodes are mounted on rectangular carrier faces which include an acute angle.

The intersection line of the two faces is in parallel to the line of electrodes.

The shape and arrangement of the electrodes which affect the corpuscular beam preferably depend on the desired direction of the corpuscular beam.

The individual electrodes are of square, rectangular or parallelogram shape, two sides of which are substantially in parallel to the corpuscular beam and the other two sides are substantially at right angles to the corpuscular beam.

The individual electrodes of one line are preferably equidistantly arranged relative to the adjacent ones. The electrodes either are self-supporting, that is, they do not require a base, in this event the faces are constituted by the electrode planes of one line, or the electrodes are mounted upon supporting bodies.

The faces of said bodies, which are adjacent the corpuscular beam are electrically conductive and are protected against any irradiation through the corpuscular beam.

Furthermore, the conductive faces eliminate charging of the members and thus prevent any undesired deflections of the corpuscular beam.

The base bodies consist of a considerably high-ohmic material, preferably very pure silicon, and have an insulating layer beneath each electrode which is provided with an individual potential connection.

In this case, the face portions between the electrodes are covered with a layer made of a suitable electrically conductive material so to prevent any undesired charging effects.

The production of the base bodies is considerably simplified when they are limited by plane faces, the potential supply lines being one those faces of the base bodies which lie off the corpuscular beam.

It is an advantage considered from a technological viewpoint, when the base bodies include an obtuse angle with the carrier faces of the electrodes.

It is a further advantage for the operation of the electron optical device when the opposing faces carrying the electrodes form a slot and are mirror symmetrical to the central plane of the slot. Thus it is easier to control the corpuscular beams independently from each other.

It is still a further advantage when the potential supply leads at the Off-side of the base bodies are covered by an electrically conductive plate. Thus any back-effects upon the corpuscular beam by the leads are eliminated, so is any irradiation of the leads and of the intermediate spaces by stray electrons or ions. The potential supply leads are connected to a computer via electronic circuits and registers.

The computer controls according to a given program the potentials for the electrodes of one line. The electronic circuit can be a two-point controller applying either a standard potential or a fixed potential derived from said standard potentials, to said electrodes.

Alternatively, the electronic circuit is a DA converter of n-bits, and applies a selective potential unequal $2^n$ derived from the standard potential to the electrodes so that a stagewise deflection of the individual beams is feasible.

By virtue of the inventional arrangement a multiple deflection system is provided which permits a simultaneous deflection of a great number of corpuscular beams, for example, 518 beams, for which the informations are simultaneously applied to the electrodes of one line of electrodes.

Figure 2:
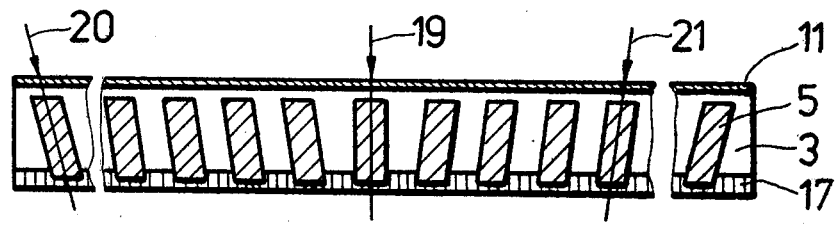
Figure 3:
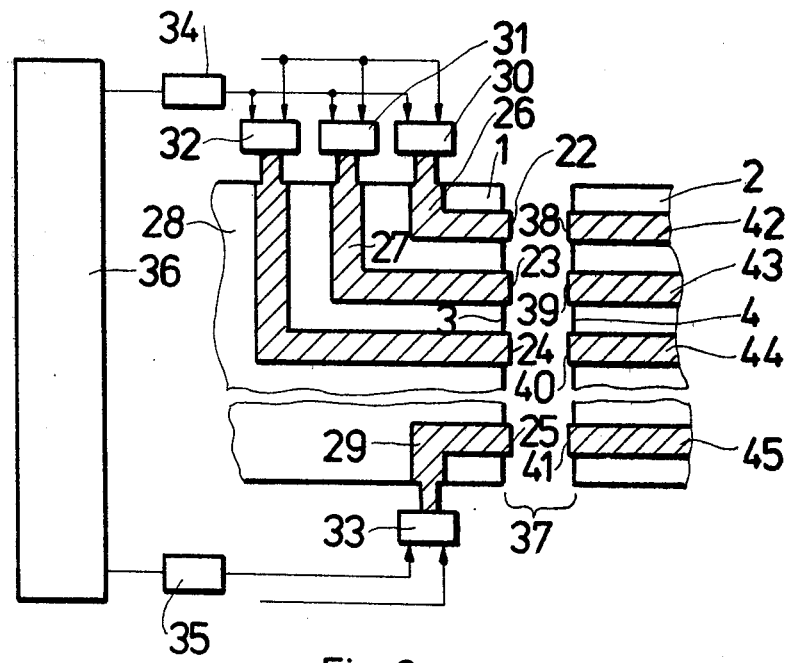
Figure 4:
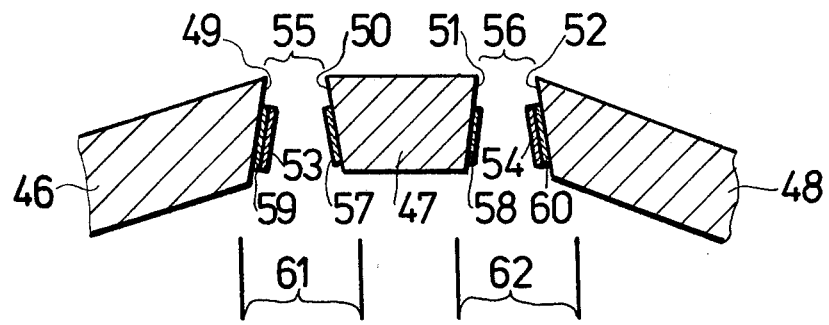
Figure 5:
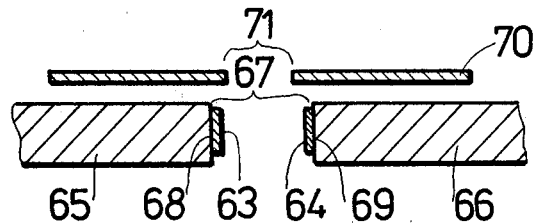
Figure 6:
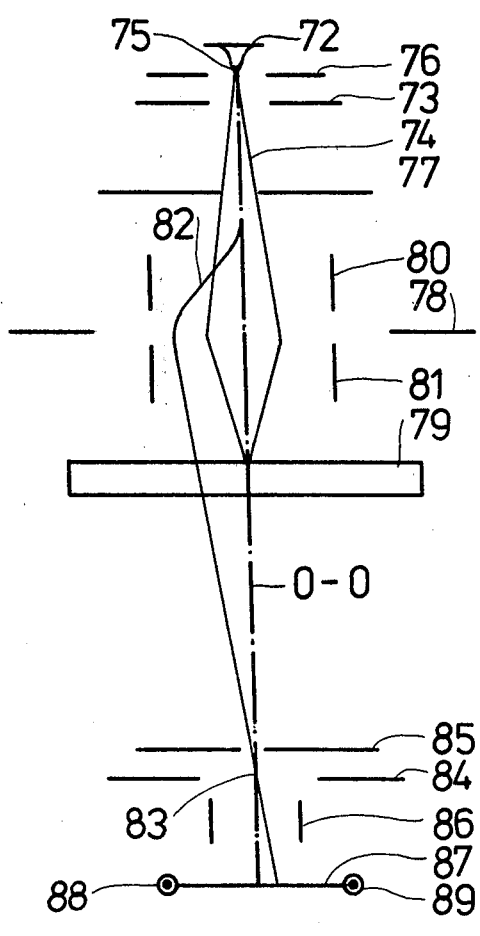

In order that the invention may be more readily understood reference is made to the accompanying drawings which illustrate diagrammatically and by way of example two embodiments thereof and where FIG. 1 is a schematic sectional view of a deflection system of the invention, FIG. 2 is a schematic view of one of the opposing faces of the deflection system, FIG. 3 a potential supply system for the electrodes shown in FIGS. 1 and 2, FIG. 4 a schematic view of a two-slotted deflection system, FIG. 5 a schematic view of a deflection system including an aperture, and FIG. 6 a schematic view of an electron beam device including an inventional deflection system.

In FIG. 1 a deflection system comprises two base bodies 1, 2 made of quartz which are symmetrically and inclinedly arranged relative to a plane of symmetry x—x and, hence, to each other. The base bodies 1, 2 have faces 3 and 4, respectively, which include an angle $\alpha$ and carry each a plurality (>100) of electrodes 5 and 6, respectively.

According to the angle $\alpha$ the faces 3 and 4 have an upper distance relative to each other $a_o$ and a bottom distance $a_u$, where $a_u > a_o$.

The top faces 7 and 8, respectively, of the base bodies 1, 2 are provided with leading edge electrodes 11 and 12, respectively.

The potential supply leads 15 and 16 for the electrodes 5, 6 are arranged upon the bottom faces 13 and 14, respectively, and are covered by a sheet 17 and 18, respectively, made of electrically conductive material. The bottom faces 13 and 14 include obtuse angles $\delta$ with the adjacent faces 3 and 4, respectively.

FIG. 2 shows a view of the carrier face 3 parallel to the drawing plane with the electrodes 5, the number of which is, for sake of simplicity, reduced. Again 11 designates the leading edge electrode and 17 the protective sheet.

Three corpuscular beams 20, 19, 21, by example, demonstrate the radiation beams and the associated electrodes 5 are so inclined that their longer sides are in parallel to the passing beams.

The leading edge electrode 11 is made of a material selected from the heavy metals and serves to protect the slot between the faces 3, 4 (FIG. 1) against direct irradiation.

The electrodes 5 consist of a material of high conductivity preferably of a thin metal layer. The faces between the electrodes are of low electric conductivity so that stray electrons do not provoke potential variations and the potentials across adjacent electrodes do not produce interfering currents.

FIG. 3 shows a bottom view of the arrangement of FIG. 1 with the protective sheet 17 removed better to show the electrode leads.

A part of the base body 1 is provided with electrodes 22, 23, 24, 25 and associated leads 26, 27, 28, 29 for connecting the former to respective electronic circuits 30, 31, 32, 33.

The latter are connected via registers 34, 35 to a computer 36.

The base body 2 forming a wedge-shaped slot 37 with the base body 1 is provided on the face 4 with electrodes 38, 39, 40, 41 which are in mirror symmetry relative to those electrodes on the face 3. The electrodes 38, 39, 40, 41 are connected to respective leads 42, 43, 44, 45.

The counter parts to the electronic circuits 30 to 33 and to the stores 34, 35 which are also connected to the computer 36 are omitted for the sake of simplicity.

Each circuit 30 to 33 applies a set potential (relative to the entire electron-optical system) or a zero-potential via the associated potential leads 26 to 39 to the electrodes 22 to 25.

An equal or opposite potential is applied to the opposite electrodes 38 to 41 via the leads 42 to 45. According to the potentials applied to opposite electrodes 22–38, 23–39, 24–40, and 25–40, respectively, a not shown corpuscular beam is either deflected at right angles to the slot 37, or not deflected (equal potential). The switching states of the electronic circuits 30 to 33 are controled by the registers 34 and 35, respectively, which receive the informations form the computer 36, and, hence, the electrodes 22 to 25 are set to the required potentials.

In the same manner the computer 36 controls the electrodes 38 to 41.

FIG. 4 shows a deflection system constituted of three base bodies 46, 47, 48 made of hyper-pure silicon which include two wedge-shaped slots 55, 56. The base bodies 46, 47, 48 have opposing faces 49 and 50, respectively, and 55 and 52, respectively. The electrodes 53 and 54 attached to the faces 49 and 52, respectively are arranged in analogy to FIG. 2. The base body 47 has layer electrodes 57 and 58 on faces 50 and 51, respectively, which are on zero-potential. In contrast to FIG. 2 the electrodes 53, 54 are mounted in insulating equal sized layers 59, 60 made of $SiO_2$ between the faces 49, 52 on the one hand, and the electrodes 53, 54 on the other hand.

The two slot embodiment permits either an alternative or simultaneous operation of the two slots.

In the first event the electrodes of the one slot 55 are programmed while the electrodes of the other slot perform according to a charged program, and vice versa. In the second event both slots 55 and 56 perform simultaneously and a subsequent not shown deflection system fuses the two portions of the corpuscular beam in a target plane (FIG. 6).

Thus it is feasible to realise grey stages.

In FIG. 5 two base bodies 65, 66 are provided with two rows of electrodes 63, and 64, respectively, on the faces 68 and 69, respectively which are parallel to each other and form a slot 67.

An aperture 70 is arranged before said slot 67 the opening 71 of which is smaller than the space between the opposing faces 68, 69 so that the base bodies 65, 66 are protected against stray corpusculares.

The further details of this embodiment are in analogy to FIGS. 1 to 3.

In FIG. 6 an electron gun which comprises a cathode 72, an anode 73 and an aperture 77, emits an electron beam 74, having a crossover 75, the intensity of the beam is controlled by a wehnelt electrode 76, whereas the beam cross-section is defined by the aperture 77.

An electron lens 78 focusses the electron beam 74 into a multiple deflection system 79 which is object of the invention.

Before and after the lens 78, considered in the progation direction of the electron beam 74, a deflection system 80 and 81, respectively, is arranged. The deflection system 80 deflects an electron beam 82 off an axis 0—0 of the electron beam device whereas the deflection system 81 focusses the beam 82 into the center 83 of a second lens 84.

A black-out aperture 85 is arranged before the lens 84. A further deflection system 86 is arranged after the lens 84 for fine positioning the electron beam 82 in a target plane 87 which coincides with a slide 87 displaceable in bearings 88, 89 which are at right angles to the drawing-plane.

The lens 78 images the cross-over 75 into the multiple deflection system 79 and evenly illuminates the slot thereof.

The aperture 77 which is also evenly illuminated is simultaneously imaged into the black-out aperture 85 in such a manner that the diameter of this image is about half the diameter of the black-out aperture 85. The deflection of the beam 82 due to the multiple deflection system 79 effects a displacement of the image of the aperture 77 at right angles to the drawing plane.

Thus a partial or entire bright-dark scanning is obtained. The electronic circuits of the multiple deflection system 79 as described in connection with FIG. 3 bright-dark control the electron beam 82 in dependence on the number of switching states. Apart from the dark-state a switching of three grey states is feasible. The deflection potentials associated to these grey states are of a non-linear division. The lens 84 images the upper plane of the multiple deflection system 79 into the target plane 87 where it produces a point line the brightness of each individual point being controllable.

In this target plane 87 the surface of a not shown target is processed.

Alternatively it is feasible to transfer the target plane by a further lens in order to permit a more suitable positioning of a target, such as adjusting of the latter, including demagnification etc.

We claim:

1. A corpuscular beam processing device comprising subsequently about an optical axis in mutual electron optical alignment an electron gun for producing a corpuscular beam,
an aperture adjacent to said electron gun for defining said corpuscular beam cross-section,
a first deflection system,
a first electron lens,
a second deflection system,
an electrostatic deflection system,
a black-out aperture,
at least a second electron lens having a center in said optical axis,
a third deflection system,
a target plane,
a slide being displaceably arranged in said target plane,
said first deflection system being for deflecting said corpuscular beam off said optical axis,
said first electron lens being for focusing said corpuscular beam into said electrostatic deflection system,
said second deflection system being for directing said corpuscular beam into said center of said second electron lens,
said second electron lens being arranged adjacent said target plane,
said electrostatic deflection system comprising at least two electrode supporting bodies,
each of said bodies being provided with a face in opposition to the face of the other electrode body, each face having a leading edge in opposition to said second deflection system, the faces of said bodies having a leading edge distance $a_o$ relative to each other and a bottom distance $a_u$ relative to each other where $a_u > a_o$,
each of said bodies having limiting plane faces in opposition to said black-out aperture,
said limiting plane faces including obtuse angles with the associated one of said both faces,
a plurality of electrodes being provided at least on one of said both faces, said electrodes being of high conductive material compared to the material of said faces,
said electrodes being adjacently arranged along the direction of the greatest extension of said one of said both faces,
each electrode of said plurality of electrodes on said one of said both faces being provided with an individual supply lead,
said one of said both faces being of low electric conductivity compared to the electrode material,
each of said plurality of electrodes is of rectangular shape having two sides in parallel and two sides at right angles to the corpuscular beam for substantially each deflected off the optical axis position of said corpuscular beam,
said electrostatic deflection system being for deflecting said corpuscular beam off and directing said corpuscular beam to, respectively, said target plane,
said black-out aperture being for trapping said corpuscular beam when deflected off the target plane,
said third deflection system being for fine positioning said corpuscular beam in said target plane,
said second electron lens being for imaging said leading edges into said target plane.

2. An electrostatic deflection system as claimed in claim 1, wherein the electrodes upon said face of the other electrode body are in electrically conductive connection with each other.

3. An electrostatic deflection system as claimed in claim 1, wherein said face of the other electrode body is covered by only one electrode.

4. An electrostatic deflection system as claimed in claim 1, wherein the electrodes of said one of said both faces are substantially equidistantly spaced apart.

5. An electrostatic deflection system as claimed in claim 1, wherein said leading edges on each of said bodies are electrically conductive and insulated relative to the electrodes.

6. An electrostatic deflection system as claimed in claim 5, wherein the bodies are made of hyper pure silicon and wherein an insulating layer is provided between the electrodes having an individual potential supply and the respective body.

7. An electrostatic deflection system as claimed in claim 5, wherein the bodies consist of an insulating material.

8. An electrostatic deflection system as claimed in claim 5, wherein the potential supply leads are on the Off-side limiting plane faces with respect to the corpuscular beam.

9. An electrostatic deflection system as claimed in claim 1, wherein the opposing faces from a slot, said electrodes arranged upon said both faces are in mirror symmetry to a central plane of the slot.

10. An electrostatic deflection system as claimed in claim 8, wherein the potential supply leads are protected by an electrically conductive sheet.

11. An electrostatic deflection system as claimed in claim 10, wherein the potential supply leads are connected to a computer via electronic circuits and registers.

* * * * *